US012779845B2

(12) United States Patent
Kim et al.

(10) Patent No.: US 12,779,845 B2
(45) Date of Patent: Nov. 3, 2026

(54) INK DROP MEASUREMENT PAD, INKJET PRINTER DEVICE HAVING SAME, AND METHOD FOR MEASURING INK DROP

(71) Applicant: UNIJET CO., LTD., Gyeonggi-do (KR)

(72) Inventors: Seog Soon Kim, Gyeonggi-do (KR); Sung Jin Lee, Seoul (KR)

(73) Assignee: UNIJET CO., LTD., Gyeonggi-do (KR)

( * ) Notice: Subject to any disclaimer, the term of this patent is extended or adjusted under 35 U.S.C. 154(b) by 308 days.

(21) Appl. No.: 18/724,784

(22) PCT Filed: Oct. 17, 2022

(86) PCT No.: PCT/KR2022/015680

§ 371 (c)(1),
(2) Date: Jun. 27, 2024

(87) PCT Pub. No.: WO2023/128174

PCT Pub. Date: Jul. 6, 2023

(65) Prior Publication Data

US 2025/0065619 A1 Feb. 27, 2025

(30) Foreign Application Priority Data

Dec. 30, 2021 (KR) ........................ 10-2021-0192068

(51) Int. Cl.
*G01N 15/00* (2024.01)
*B41J 2/045* (2006.01)
(Continued)

(52) U.S. Cl.
CPC ......... *B41J 2/0456* (2013.01); *B41J 2/04535* (2013.01); *H10P 74/20* (2026.01);
(Continued)

(58) Field of Classification Search
CPC ... G01N 2015/0038; G01N 2015/1024; G01N 2015/1486
See application file for complete search history.

(56) References Cited

U.S. PATENT DOCUMENTS

2019/0318685 A1* 10/2019 Park ......................... G09G 3/32
2021/0050270 A1 2/2021 Kim et al.

FOREIGN PATENT DOCUMENTS

JP 2006-15244 A 1/2006
JP 2006-15693 A 1/2006
(Continued)

OTHER PUBLICATIONS

International Search Report for PCT/KR2022/015680 mailed on Jan. 18, 2023.

*Primary Examiner* — John E Breene
*Assistant Examiner* — Alex T Devito
(74) *Attorney, Agent, or Firm* — The PL Law Group, PLLC

(57) ABSTRACT

A measurement pad includes a pattern part including a plurality of groove portions arranged at pitch intervals corresponding to pitch intervals of a plurality of head nozzles, and a wall portion formed between the groove portions, a first electrode part extending in the longitudinal direction of the groove portions at the center of the groove portions, a second electrode part spaced apart from the first electrode part in the width direction and extending in the longitudinal direction of the groove portions. The length of the groove portions is formed to have a size that can include all heads existing on the same extension line which are measurement targets, and is uniformly formed in the same cross-sectional shape throughout the longitudinal direction of the groove portions.

23 Claims, 13 Drawing Sheets

(51) Int. Cl.

| | |
|---|---|
| ***H10P 74/00*** | (2026.01) |
| ***H10P 74/20*** | (2026.01) |
| ***H10W 90/00*** | (2026.01) |
| *B41J 3/407* | (2006.01) |

(52) U.S. Cl.

CPC ........... *H10P 74/238* (2026.01); *H10W 90/00* (2026.01); *B41J 2/04586* (2013.01); *B41J 3/407* (2013.01)

(56) References Cited

FOREIGN PATENT DOCUMENTS

| | | | |
|---|---|---|---|
| KR | 10-0997451 | B1 | 12/2010 |
| KR | 10-2020-0084476 | A | 7/2020 |
| KR | 10-2021-0104385 | A | 8/2021 |
| KR | 10-2509680 | B1 | 3/2023 |

* cited by examiner

INK DROP MEASUREMENT PAD, INKJET PRINTER DEVICE HAVING SAME, AND METHOD FOR MEASURING INK DROP

STATEMENT REGARDING FEDERALLY SPONSORED RESEARCH OR DEVELOPMENT

The present invention was supported by the national research and development program (Project identification number: 1415174040; Project number: 20016290; Government department name: Ministry of Trade, Industry and Energy; Project management (professional); institution name: Korea Planning & Evaluation Institute of Industrial Technology; Research project title: Electronic component industry technology development (R&D); Research title: Technology development for sub-micron-level blue light-emitting light source for modular displays; Contribution ratio: 1/1; Project performing organization name: Korea Electronics Technology Institute; Research period: Apr. 1, 2021 to Dec. 31, 2024)

CROSS REFERENCE TO RELATED APPLICATIONS AND CLAIM OF PRIORITY

This application claims benefit under 35 U.S.C. 119, 120, 121, or 365(c), and is a National Stage entry from International Application No PCT/KR2022/015680 filed on Oct. 17, 2022, which claims priority to the benefit of Korean Patent Application No. 10-2021-0192068 filed on Dec. 30, 2021 in the Korean Intellectual Property Office, the entire contents of which are incorporated herein by reference.

BACKGROUND

1. Technical Field

The present invention relates to a measurement pad for measuring an ink drop and the number of a nano LED in the ink drop, and more particularly, to a measurement pad capable of easily measuring a volume and a position of an ink drop, and the number of a nano LED included in an ink drop ejected from each of nozzles, and a measurement method and inkjet printer device using the measurement pad.

2. Background Art

As display technologies develop, displays having a higher luminance, a longer lifetime, and a broader color rendering index (CRI) are required. Accordingly, self-emissive type OLED displays, which are better than LCDs in terms of all characteristics, have been used.

However, even the OLED displays have a lifetime problem, and a narrow CRI due to a relatively wide full width at half maximum, and thus better displays are developing. Among newly developing displays, new displays using LEDs having various sizes, for example, mini LED, micro LED, and nano LED, are developing.

Technologies for nano LED displays of these displays print inkjetable inks including nano LEDs by using use an inkjet printing technique and a dielectrophoresis technique in order to accurately align, on each of pixels of the displays, a plurality of nano LEDs each having a size of 4-10 μm in length and 0.5-1 μm in thickness. Here, in order to supply a fixed quantity of nano LEDs to each pixel, an ink in which the nano LEDs are uniformly dispersed is ejected from an inkjet head to coat each pixel with a fixed amount of an ink, i.e., ink having the number of the fixed quantity of nano LEDs.

In order to supply the exact number of the nano LEDs to each pixel, the number of the nano LEDs in each of ink drops ejected from nozzles of a plurality of inkjet heads needs to be uniform. And repeated measurements, and adjustment of ejection conditions such as jetting waveform given to each of the inkjet heads, need to be performed to optimize ink ejection conditions so that the number of the nano LEDs in each of ink drops ejected from all the nozzles is uniform.

In application of the inkjet printing techniques, particularly in a case in which the fixed amount of ink has to be applied onto a required pixel uniformly within a few percent, a deviation between ink drop volumes ejected from each nozzle needs to be accurately measured and compensated. In addition, a deviation in ink drop volume between heads needs to be compensated.

However, a processing deviation and an assembly deviation of the head are inevitable during a device manufacturing process, and there is also a deviation in ink drop applied positions of each nozzle according to ejection conditions.

These deviations in ink drop positions lead to problems that cause quality degradation or defects in pixel printing.

In order to solve the above problems, a technology is known of applying a strobe technology in which a digital camera, an optical device, and a LED lighting device are installed on both side surfaces of an inkjet head to be alignment with a height of the head, and an ink drop ejection time and flickering of the LED lighting device are synchronized to produce an image that seems to show one ink drop as if ink drops ejected onto a screen stop at one position during flight.

However, the biggest problem of this method is that ink drops of a still image seen at a high ejection frequency are not an image of one ink drop, but overlapping images of a plurality of ink drops having position errors and size errors according to the ejection frequency.

Thus, this method is subject to a large measurement error due to a shape of the ink drop, straightness of the ink drop, a strobe error, errors of a plurality of actual ink drops, a difference in lighting, and a recognition method and error (limited resolution) of a vision recognition technique.

In addition, this method has problems that a position accuracy of ink drops ejected in a front or rear direction of a camera is impossible to measure, a position accuracy of ink drops ejected in left and right directions is also difficult to measure, and additional time is required. Moreover, the number of nano LEDs included in the ink drop ejected through this technique is impossible to measure rapidly and simultaneously.

SUMMARY

The present invention is to solve the above problems, and provides a method capable of accurately processing a volume and a position of an ink drop, and the number of a nano LED in the ink drop within a short period of time.

The objects of the present invention are not limited to the aforesaid, but other technical objects not described herein will be clearly understood by those skilled in the art from descriptions below.

In order to solve the above problems, the present invention provides a pad for measuring an ink drop which is a measurement pad provided to measure a volume, a position, and the number of a nano LED of the ink drop deposited by spraying, in a predetermined volume, an ink including a plurality of nano LEDs from a nozzle of a head of an inkjet device, the pad including a pattern part including a plurality of portions arranged groove at a pitch corresponding to a pitch between a plurality of head nozzles, and a wall portion provided between the groove portions, wherein, at a center of each of the groove portions, a first electrode part extends in a longitudinal direction of the groove portion, and a second electrode part is spaced apart from the first electrode part in a width direction to extend in the longitudinal direction of the groove portion, wherein the groove portion is provided to have a length having a size to include all heads existing on the same extension line which are objects to be measured, and is uniformly formed in the same cross-sectional shape along the entire length of the groove portion.

In the pad according to the present invention, the pattern part and the electrode parts are provided in the same direction as a printing direction or a direction perpendicular to the printing direction.

In the pad according to the present invention, a spaced distance between the first electrode part and the second electrode part has a size to be in contact with both ends of the nano LED.

In the pad according to the present invention, a first electrode contact pad is connected to one end of the first electrode part, and a second electrode contact pad is connected to one end of the second electrode part, wherein, when an alternating voltage is applied through each of the first and second electrode contact pads, a force is generated due to an electric field inside the groove portion so that due to dielectrophoresis, one end of the nano LED is aligned with the first electrode, and the other end of the nano LED is aligned to be oriented to the second electrode.

In the pad according to the present invention, the first electrode contact pad is disposed at one side in a width direction of the pad, and the second electrode contact pad is disposed at the other side in the width direction of the pad.

In the pad according to the present invention, the pad is supplied in the form of a flat sheet.

In the pad according to the present invention, the pad is continuously supplied by being provided in the form of a roll so as to be supplied by a predetermined length in a width corresponding to a printing width of a head module including a plurality of inkjet heads and to be removed from the inkjet device.

An inkjet device including the pad for measuring the ink drop according to the present invention includes: an inkjet printer part; and a head maintenance part installed in parallel with the inkjet printer part, wherein the inkjet printer part includes: a Y1 stage on which a work holder that supports a substrate is disposed and which is provided to be movable in a Y direction; an X1 stage, on which an inkjet head is installed to be higher than a height of the substrate (1000) and which is installed to extend so that the X1 stage is movable to a Y2: stage of the head maintenance part in an X direction; a first transfer probe unit including a first transfer stage, which is installed above the substrate to perform transfer so that a position is adjustable in X, Y, and Z directions with respect to the substrate, and a first probe installed above the first transfer stage; alternating voltage applying device connected to the first probe to apply an alternating voltage so as to generate an electric field on the substrate; and a first ink-drop measurement device that measures a size, a position, and the number of a nano LED of an ink drop ejected on a pixel of the substrate, wherein the head maintenance part includes: a Y2 stage provided in parallel with the Y1 stage to be movable in the Y direction; a plate device installed on the Y2 stage and that fixes the pad; a second transfer probe unit including a second transfer stage, which is installed above the pad to perform transfer so that a position is adjustable in the X, Y, and Z directions with respect to the pad, and a second probe installed above the second transfer stage; an alternating voltage applying device connected to the second probe to apply an alternating voltage so as to generate an electric field on the substrate; and a second ink-drop measurement device that measures a size, a position, and the number of a nano LED of an ink drop ejected on a groove portion of the pad.

In the inkjet printer device according to the present invention, an X2 stage is further installed on the head maintenance part so as to be movable in the X direction, wherein an ink removing device that removes the ink drop deposited on the pad is installed on the X2 stage.

In the inkjet printer device according to the present invention, a roll supply device that continuously supplies the pad to the plate device in a roll manner is further installed on the head maintenance part.

In the inkjet printer device according to the present invention, the ink removing device includes a vacuum suction device that suctions the ink drop.

A method for measuring an ink drop sprayed and deposited from an inkjet head of an inkjet printing device to which the pad for measuring the ink drop according to the present invention is applied, includes: a step (s100) of forming a plurality of groove portions with spacing corresponding to a pitch of a nozzle of an inkjet device, supplying the pad in which a cross-section of each of the groove portions is formed to be uniform along the entirety of a length of the groove portion, and supporting the pad by a plate; a step (s200) of disposing the pad supported in the step (s100) to be below the inkjet head, wherein the groove portions are aligned to be disposed vertically below the nozzle; a step (s300) of applying an alternating voltage to first and second electrodes of the pad aligned in the step (s200) to generate a dielectrophoresis force by an electric field in the groove portions of the pad; a step (s400) of forming an electric field in the pad disposed in the step (s300) and simultaneously spraying an ink drop by the nozzle to deposit the ink drop onto the groove portion of the pad; a step (s500) of measuring a length and a central position deviation of each of the ink drops deposited in the step (s400) by using a low-magnification ink-drop measurement device; and a step (s600) of measuring the number of a nano LED in each of the ink drops deposited on the pad by using a high-magnification measurement device after the measurement in the step (s500).

In the method according to the present invention, in the step (s500), the ink-drop measurement device measures the length of the ink drop deposited on the pad (p) to measure a volume of the ink drop.

In the method according to the present invention, in the step (s500), the ink-drop measurement device measures a central position (c1) of the ink drop deposited on the pad (p), and compares the central position (c1) with a reference central position (c) of each of the ink drops, which is determined by an alignment mark formed on an edge of the pad, so as to measure a position deviation e (Δx, Δy) between the two positions.

In the method according to the present invention, in the step (s500), the ink drop deposited on the pad (p) is measured to perform ink drop presence/absence measurement about whether ink drops are ejected from all nozzles of an initial inkjet head after an inkjet printer is installed, so that an insufficient air removal situation or a nozzle clogging state in each of the nozzles is analyzed.

In the method according to the present invention, in the step (s500), in a case in which a specific voltage waveform is applied to a specific nozzle to eject a plurality of drops, a volume of the ink drop deposited on the pad (p) is measured to calculate a volume ejected from the specific nozzle, and a result of the calculation is used to eject a plurality of ink drops onto the same position of the pad (p) to set one or a plurality of voltage waveforms in one nozzle for achieving a target ink drop volume.

In the method according to the present invention, in the step (s500), in a case in which a specific voltage waveform is applied to a plurality of nozzles to eject a plurality of drops, a volume of the ink drop deposited on the pad (p) is measured to calculate a volume ejected from each of the nozzles, and a result of the calculation is used to eject a plurality of ink drops onto the same position of the pad (p) to set a combination of the plurality of nozzles for achieving a target ink drop volume.

In the method according to the present invention, in the step (s500), in a case in which an inkjet device including a plurality of heads ejects ink drops, a volume and a position of the ink drop deposited on the pad (p) reflecting an effect of crosstalk between nozzles of the inkjet head are measured, and results of the measurement are used to compensate for the position and the volume in each of the nozzles so as to avoid the crosstalk between the nozzles.

In the method according to the present invention, in the step (s600), the high-magnification measurement device for the ink drop measures the number of the nano LED of each of the ink drops deposited on the pad (p) to measure the number of the nano LED per volume of the ink drop.

In the method according to the present invention, in the step (s600), in a case in which a specific voltage waveform: is applied to a specific nozzle to eject a plurality of drops onto one measurement position to overlap each other, the number of the nano LED per volume of the ink drop deposited on the pad (p) is measured to calculate the number of the nano LED per ink drop ejected from the specific nozzle, and a result of the calculation is used to eject a plurality of ink drops onto the same position of the pad (p) to set one or a plurality of voltage waveforms in one nozzle for achieving the target number of the nano LED per ink drop volume.

In the method according to the present invention, in the step (s600), in a case in which a specific voltage waveform is applied to a plurality of nozzles to eject a plurality of drops onto one measurement position to overlap each other, the number of the nano LED per volume of the ink drop deposited on the pad (p) is measured to calculate the number of the nano LED per total ink drops in each of the nozzles, and a result of the calculation is used to eject a plurality of ink drops onto the same position of the pad (p) to set a combination of the plurality of nozzles for achieving the target number of the nano LED per ink drop volume.

In the method according to the present invention, in the step (s600), in a case in which an inkjet device including a plurality of heads ejects ink drops, the number of the nano LED per volume of the ink drop deposited on the pad (p) reflecting an effect of crosstalk between the nozzles of the inkjet head is measured, and a result of the measurement is used to compensate for the number of the nano LED per volume of the ink drop in each of the nozzles so as to avoid the crosstalk between the nozzles.

The method according to the present invention further includes a step (s700) of removing the ink on the pad after the measuring of the ink drops is all completed in the step (s600).

In the present invention, the inkjet printer device uses the pad for measuring the volume and the position accuracy of the ink drop and the number of the nano LEDs. Accordingly, there is the advantage that the present invention may accurately measure the volume and the position accuracy of the ink drop and the number of the nano LEDs much more simply and rapidly when compared to the related art that uses the strobe.

Thus, by using this the ink drop deposited on the pad p is measured to perform the ink drop presence/absence measurement about whether the ink drops are ejected from all the nozzles of the initial inkjet head after the inkjet printer is installed. Accordingly, there are the effects that the insufficient air removal situation or the nozzle clogging state in each nozzle may be checked, and the additional action to overcome the nozzle clogging may be performed or appropriately compensated.

Also, in the case in which the specific voltage waveform is applied to the specific nozzle to eject the plurality of drops, the volume and the number of the nano LEDs of the ink drop deposited on the pad p may be measured to calculate the volume ejected from the specific nozzle, and rapidly and easily measure the set number of the nano LEDs.

By using this, the plurality of ink drops may be ejected onto the same position of the pad p to have the effects of easily and rapidly setting the one or the plurality of voltage waveforms in the one nozzle for achieving the target ink drop volume and the target number of the nano LEDs.

In the case in which the specific voltage waveform is applied to the plurality of nozzles to eject the plurality of drops, the volume and the number of the nano LEDs of the ink drop deposited on the pad p may be measured to calculate the volume ejected from each nozzle and measure the number of the nano LEDs so that the ejection conditions are easily optimized.

By using this, the plurality of ink drops may be ejected onto the same position of the pad p to rapidly and easily set the combination of the plurality of nozzles for achieving the target ink drop volume and the target number of the nano LEDs.

Particularly, the inkjet printer device performs the operation in which the predetermined ink drops are ejected from the predetermined nozzle by the pattern information required by each nozzle. Here, due to the pressure wave generated when each nozzle performs the ejection, the crosstalk in which the surrounding nozzle is reduced in ejection speed of the ink drop and also reduced in volume thereof occurs when the nozzle performs the ejection.

Even in this case, the volume and position of the ink drop deposited on the pad p and the number of the resulting nano LEDs may be measured to have the action effects of easily adjusting and compensating the ejection conditions of the nozzle and the printing method so that the crosstalk is prevented.

The present invention may measure the impact position on the pad p in the X direction and the Y direction to measure the position of the deposited ink drop. Accordingly, the position error of the ink drop deposited by each nozzle may be rapidly and easily measured simultaneously with the ink drop volume and the number of the nano LEDs.

These results of the position error measurement may be compensated during the actual printing to enable the more precise printing.

DETAILED DESCRIPTION

Hereinafter, an embodiment of the present invention will be described with reference to the accompanying drawings.

Figure 1:
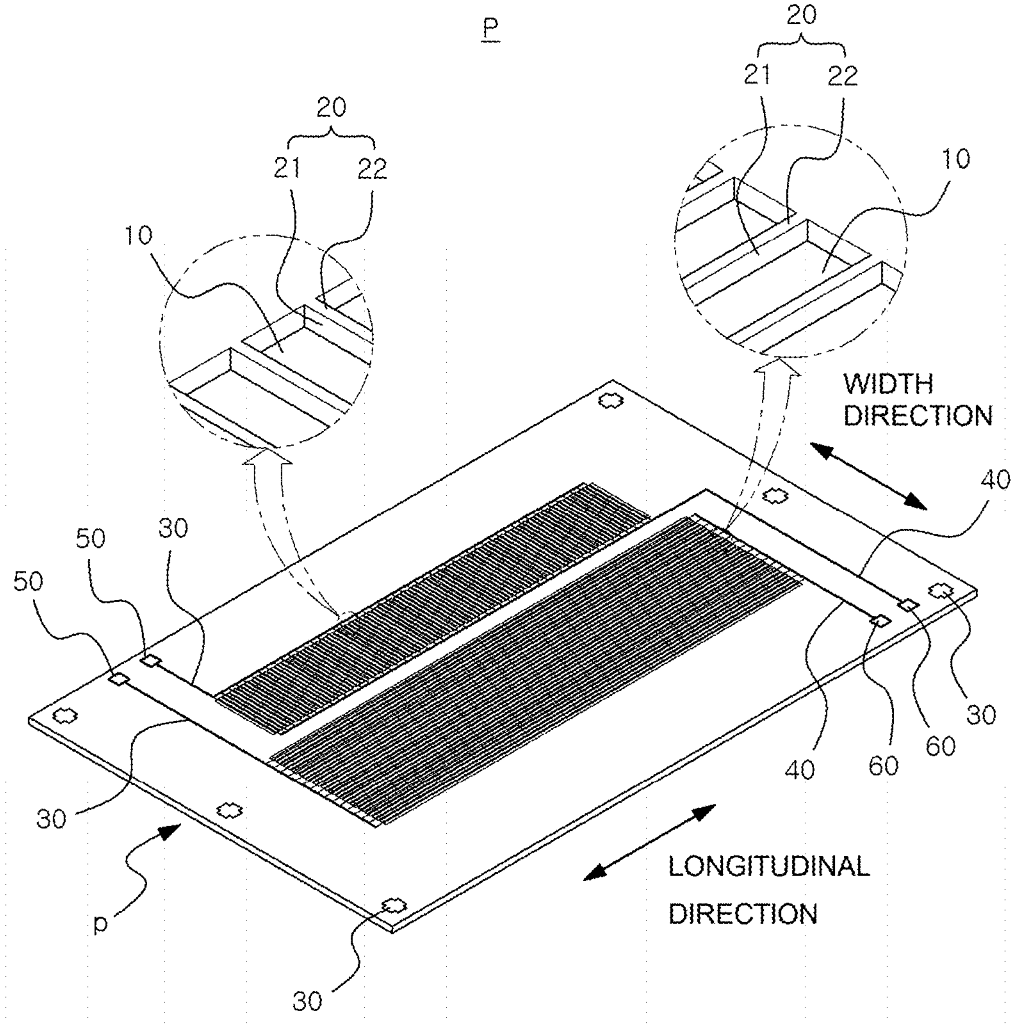
FIG. 1 is a perspective view illustrating a pad for measuring an ink drop according to the present invention.
Figure 2:
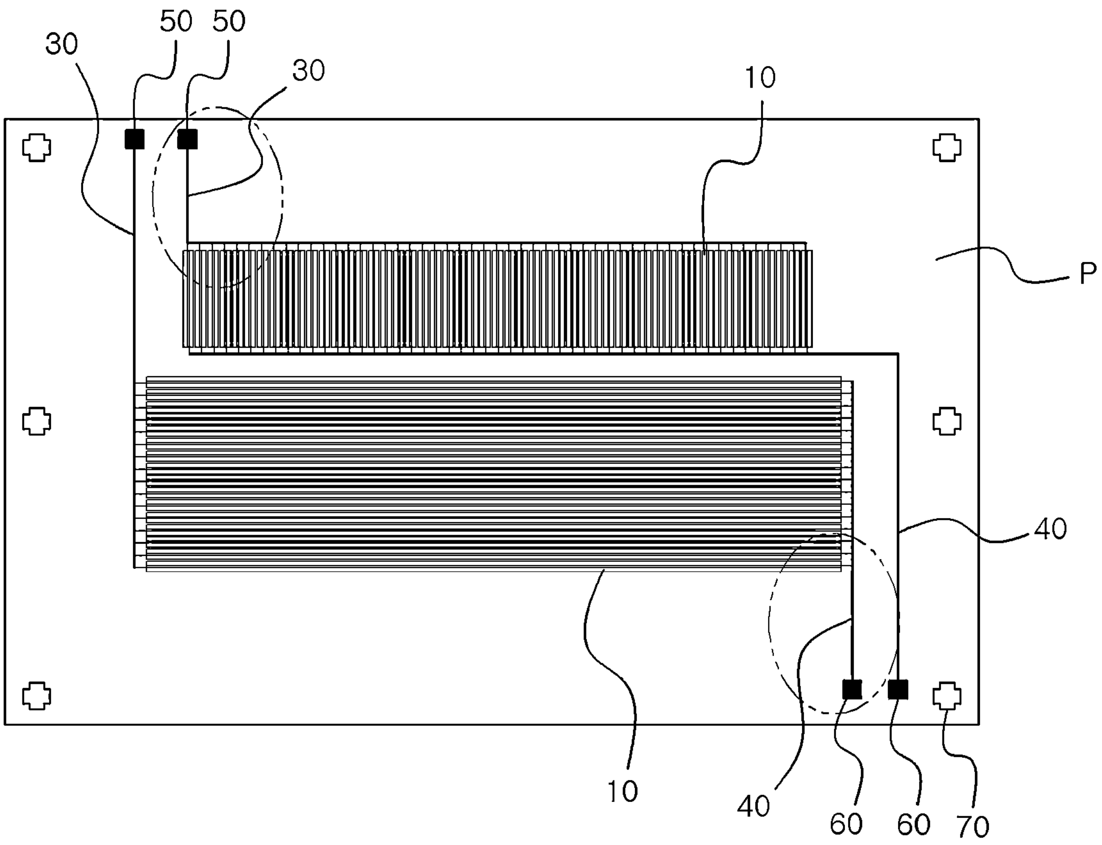
FIG. 2 is a front view illustrating a pad for measuring an ink drop according to the present invention.
Figure 3:
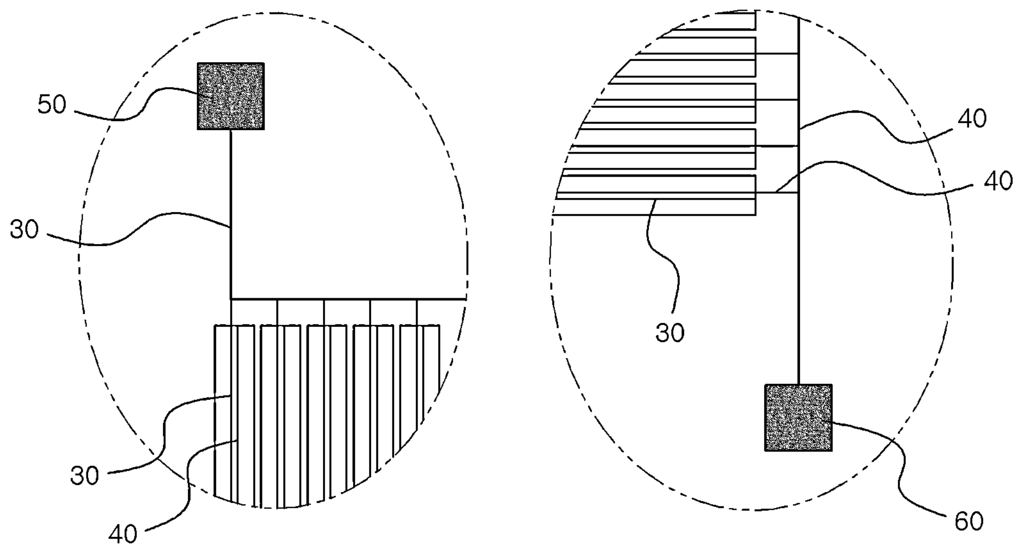
FIG. 3 is an enlarged partial view of the pad for measuring the ink drop according to the present invention in FIG. 2.

FIG. 1 is a perspective view illustrating a pad for measuring an ink drop according to the present invention. FIG. 2 is a front view illustrating a pad for measuring an ink drop according to the present invention. FIG. 3 is an enlarged partial view of the pad for measuring the ink drop according to the present invention in FIG. 2.

A pad for measuring an ink drop will be described.

In the present invention, a pad p for measuring an ink drop (hereinafter referred to as the pad) may be provided in the form of a flat sheet or film, and be formed using a hybrid method of photolithography or imprint and inkjet.

The pad p includes a plurality of groove portions 10, a plurality of wall portions 20, each of which is provided between the groove portions 10, a first electrode 30 and a second electrode 40, each of which is provided at a center of each of the groove portions 10 in a groove longitudinal direction, a first contact electrode pad 50 of the first electrode 30 and a second contact electrode pad 60 of the second electrode 40, to which a probe unit is in contact to apply a voltage, and an alignment mark 70.

The wall portion 20 includes a side wall portion 21 which protrudes upward from each of both sides of the groove portion 10, and an upper wall portion 22 provided on a top surface between the side wall portion 21 and the side wall portion 21.

The upper wall portion 22 provided on the top surface between the side wall portions 21 is provided.

The alignment mark 70 is provided on each of edges of the pad p along a printing width of a head or heads. The alignment mark 70 may be omitted according to positions and shapes of the first contact electrode pad 50 and the second contact electrode pad 60.

A distance between the plurality of groove portions 10 is equal to a nozzle pitch, or is a multiple or divisor of the nozzle pitch.

That is, when a 600 npi (nozzle per inch) head is used, the distance between the groove portions may be 1200 npi, 1800 npi, 2400 npi, or the like that is a multiple of 600 npi, or may be 300 npi, 200 npi, 100 npi or the like that is a divisor of 600 npi.

The groove portion 10 may have a length to include all of the nozzles in a horizontal arrangement of a plurality of heads in an inkjet device.

Each of a depth and a width of the groove portion 10 is defined to be maintained in the same size along the entire length of the groove portion 10.

A cross-section of the groove portion 10 has a rectangular shape in this embodiment, but is not limited thereto. For example, the shape of the cross-section of the groove portion 10 may include various shapes such as an inverted triangle or semicircular shape as long as being a shape in which the same cross-section is maintained along the entire length of the groove portion.

The width and depth of the groove portion 10 may be determined to achieve an ink property, which is related to ink spreading control characteristics such as viscosity, surface tension, drying characteristics, and polarity of ink to be used, and sufficient ink drop spreading which is required for measurement precision according to a surface condition such as surface tension and roughness of a groove and a bottom surface of the groove.

As illustrated in FIG. 2, both of the groove portion 10 defined in the same direction as the printing direction and the groove portion 10 defined in a direction perpendicular to the printing direction are provided in the pad p.

When the groove portions 10 in the printing direction and the direction perpendicular to the printing direction are provided together in one sheet of pad p, ink drop impact position errors of nozzles in the printing direction and the direction perpendicular to the printing direction, respectively, may be measured simultaneously.

Figure 9A:
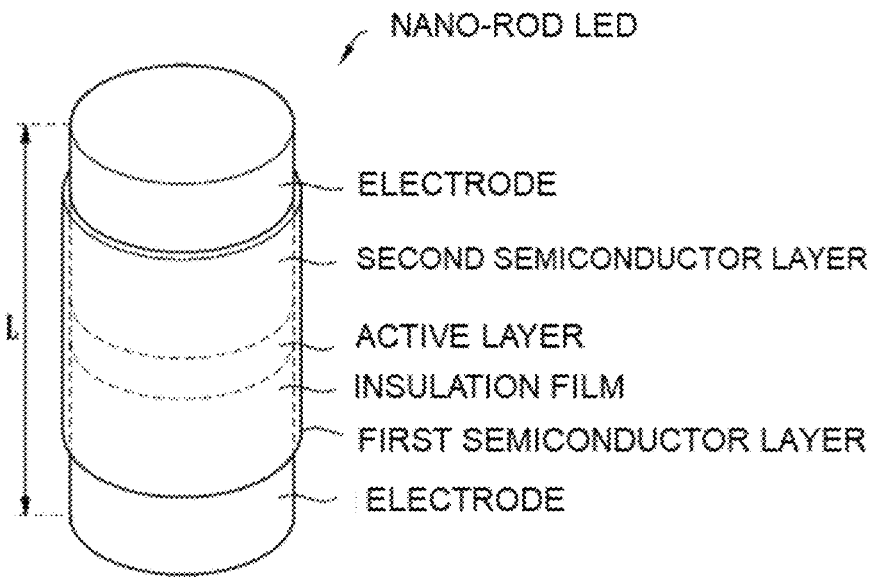
FIGS. 9A to 9C are views illustrating various shapes of a nano LED included inside an ink drop according to the present invention.
Figure 9B:
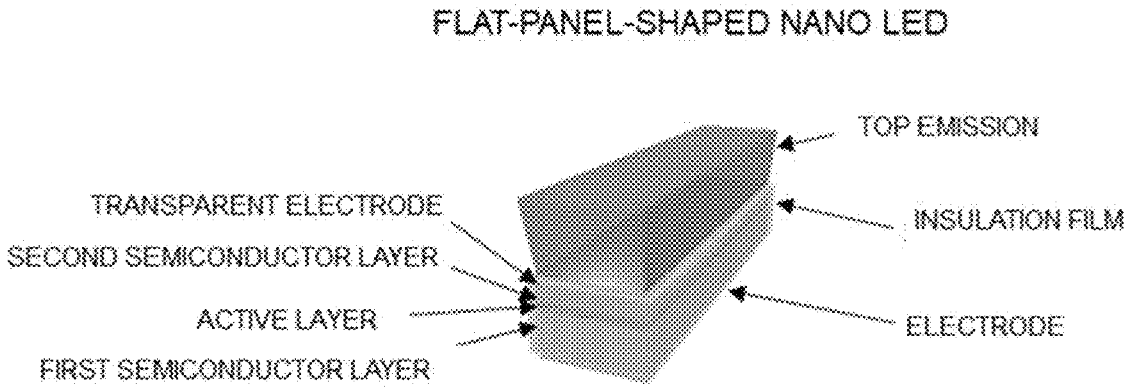
Figure 9C:
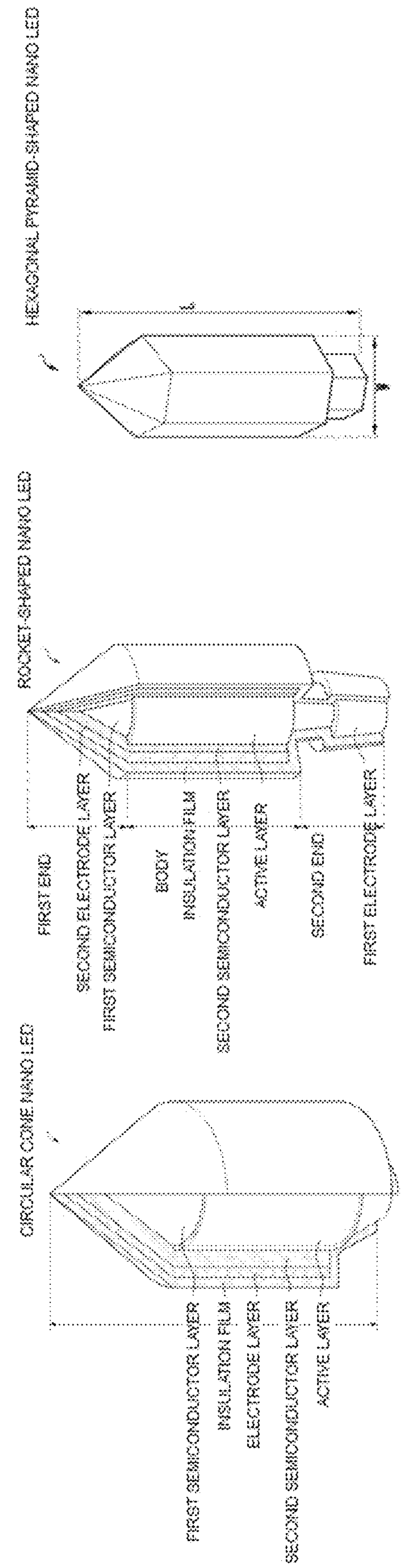
Figure 10:
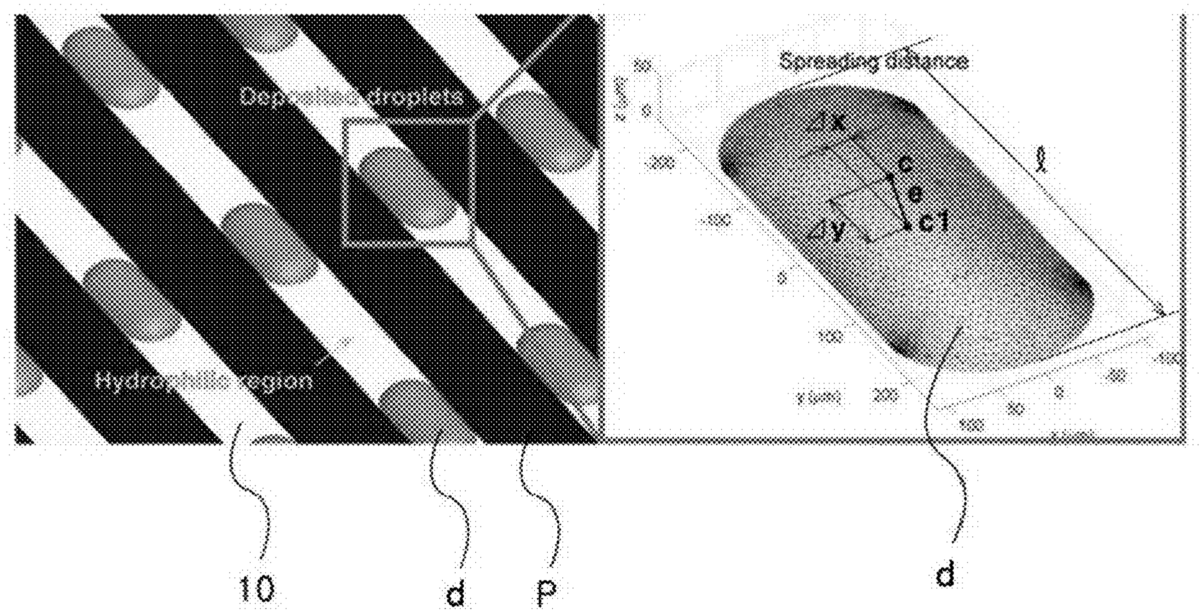
FIG. 10 is a view illustrating a state in which an ink is deposited throughout a pad for measuring an ink drop according to the present invention.

Alternatively, in the pad p, according to a purpose of measurement, the groove portion 10 may be installed in the printing direction as illustrated in FIGS. 9A to 9C or may be provided in the direction perpendicular to the printing direction as illustrated in FIG. 10.

The first electrode 30 and the second electrode 40 are provided inside the groove portion 10 in the groove longitudinal direction. A distance between, and respective widths and thicknesses of, the first electrode 30 and the second electrode 40 may vary depending on a length and a shape of a nano LED to be applied, a dipole characteristic of the nano LED, and dielectrophoresis (DEP) conditions.

In particular, the distance needs to be adjusted so that electrodes at both ends of the nano LED are seated on the first electrode 30 and the second electrode 40.

For example, when the nano LED electrode has a size of 4 μm, and each of the electrodes at both the ends has a size of 0.5 μm to 1 μm, the distance between the first electrode 30 and the second electrode 40 may be adjusted to be 1.5 μm to 2 μm.

A width of the first electrode 30 and the second electrode 40 may be 3 μm or more, and the entirety of a remaining width from the center of the groove portion 10 to the wall portion 20 except the distance between the electrodes may be made as the electrode.

The thickness of each of the first electrode 30 and the second electrode 40 may be 1 μm or more, but different according to electrical characteristics of an electrode material and a manufacture method.

As the groove portions 10 in the printing direction and the direction perpendicular to the printing direction are provided together in one sheet of pad p, ink drop impact position errors of nozzles in the printing direction and the direction perpendicular to the printing direction, respectively, may be measured simultaneously.

In addition, the entirety of the pad p may be made of one material, or alternatively the groove portion 10 may be made of a hydrophilic material so that the ink drops are well accommodated, and the wall portion 20 may be made of a liquid-repellent material.

Alternatively, the pad p may be made of a hydrophilic material or subjected to hydrophilic coating, the side wall portion 21 of the groove portion 10 may be made of a lyophilic material or subjected to hydrophilic coating, and the upper wall portion 22 may be made of or coated with a liquid-repellent material so as to have liquid repellent properties.

The pad p may be made of a transparent material as a whole so that the pad p is illuminated from below.

Alternatively, the pad p may be provided so that a color of the groove portion 10 and a color of the wall portion 20 are different from each other to easily distinguish the groove portion 10 and the wall portion 20.

Alternatively, the pad p may be provided so that the groove portion 10 is made of a transparent material, and the wall portion 20 has a color so as to be easily distinguished.

A different color may be applied as the color of the groove portion 10 or the color of the wall portion 20 as long as easily distinguishing the ink drops and the nano LEDs from the groove portion 10 and the wall portion 20.

The pad p may be supplied in the form of a flat sheet so as to be mounted on a flat plate device of the inkjet device.

Alternatively, the pad p may be continuously supplied by being provided in the form of a roll so as to be easily supplied to the inkjet device by a predetermined length in a width corresponding to an inkjet head width and be easily removed from the inkjet device.

The pad p may be supplied to the inkjet device in a form of a sheet having a rectangular shape or continuously supplied in a form of a roll having a width corresponding to a head width.

Figure 4:
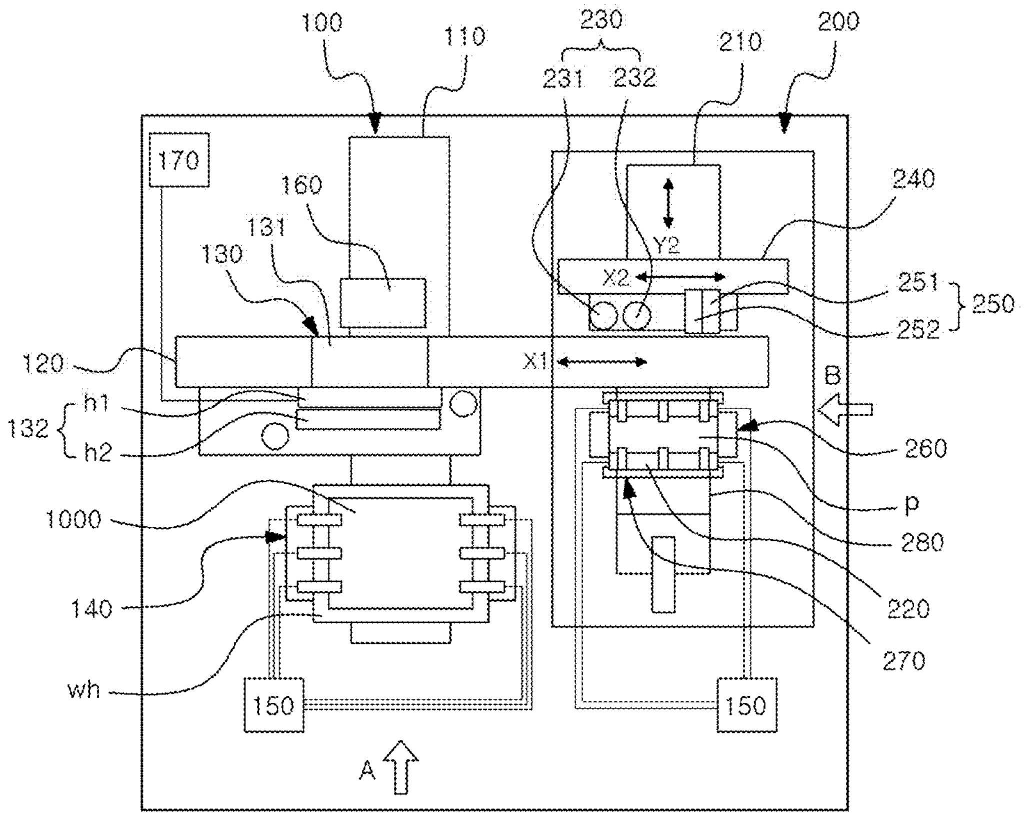
FIG. 4 is a plan view illustrating an inkjet printer device to which a pad for measuring an ink drop is applied according to the present invention.
Figure 5:
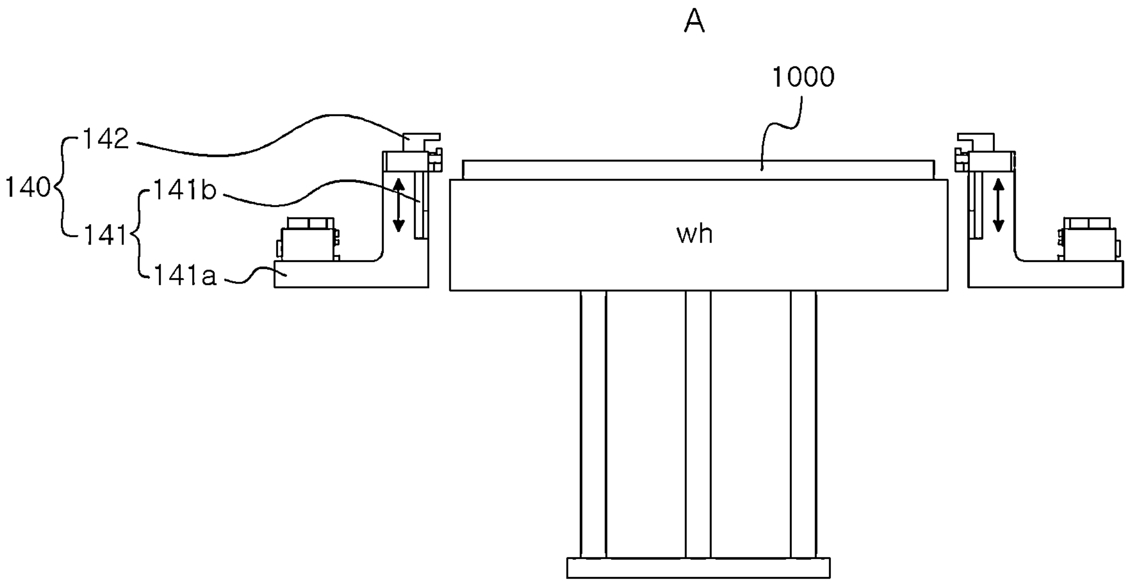
FIG. 5 is a front view of an inkjet printer device to which a pad for measuring an ink drop is applied according to the present invention, when viewed from A.
Figure 6:
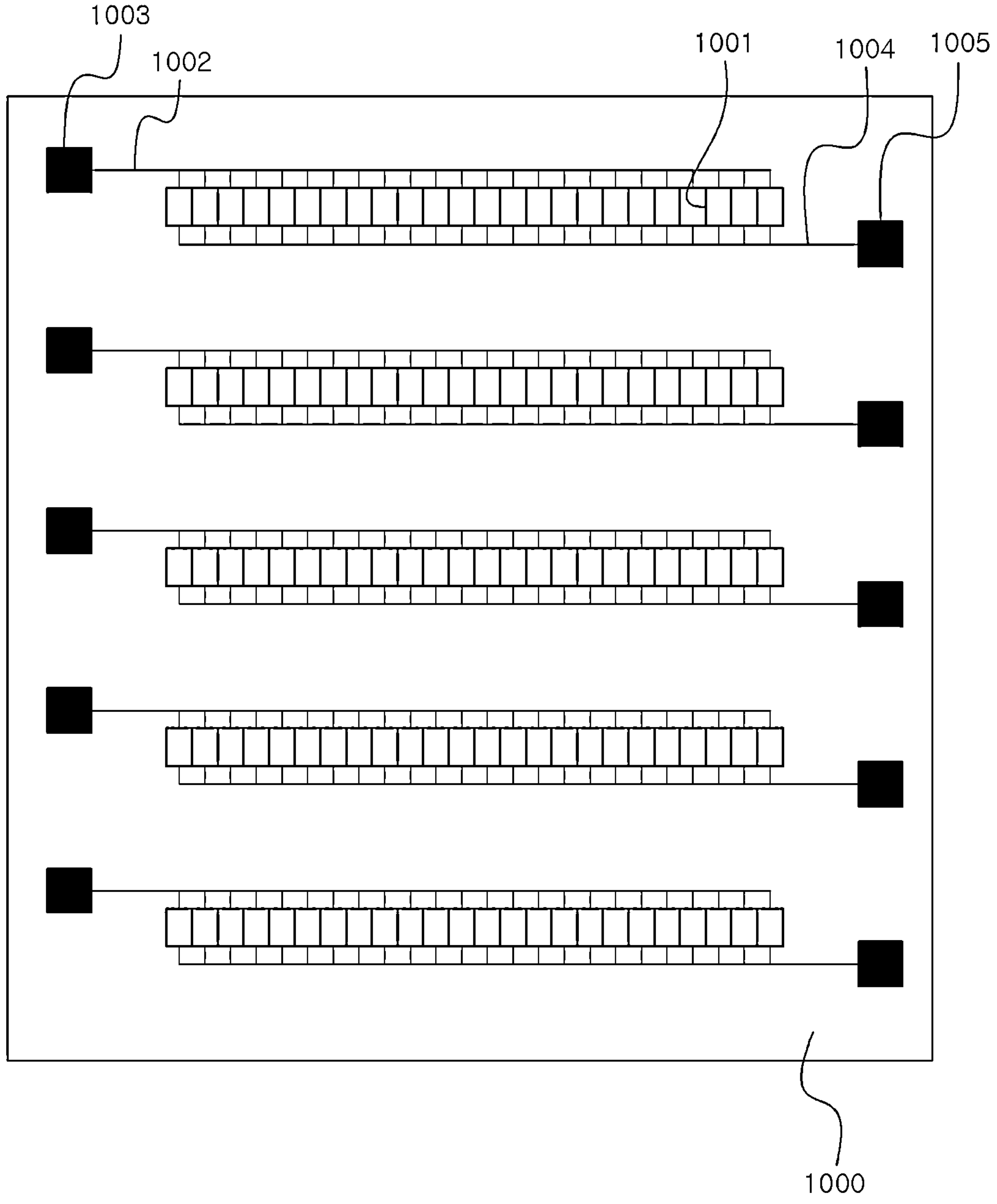
FIG. 6 is a view illustrating a substrate applied to an inkjet printer device to which a pad for measuring an ink drop is applied according to the present invention.

FIG. 4 is a plan view illustrating an inkjet printer device to which a pad for measuring an ink drop is applied according to the present invention. FIG. 5 is a front view of an inkjet printer device to which a pad for measuring an ink drop is applied according to the present invention, when viewed from A. FIG. 6 is a view illustrating a substrate applied to an inkjet printer device to which a pad for measuring an ink drop is applied according to the present invention.

Next, an inkjet printer device provided with the pad described above will be described.

An inkjet printer device D includes an inkjet printer part 100, and a head maintenance part 200 installed in parallel with the inkjet printer part 100.

The inkjet printer unit 100 includes a Y1 stage 110, on which a work holder wh on which a substrate 1000 is disposed is installed and which is provided to be movable in a Y direction, and an X1 stage 120, on which an inkjet head h is installed to be higher than a height of the substrate 1000 and which is installed to extend so that the X1 stage 120 is movable to a Y2 stage 210 of the head maintenance part 200 in an X direction, a head part 130 which is installed on the X1 stage 120, and a probe unit 140 which applies an electric field to the substrate 1000.

The head part 130 includes an ink supply device 131 that supplies an ink, and a head portion 132 that sprays the ink supplied from the ink supply device 131.

The head portion 132 includes a plurality of heads h1 and h2 disposed to overlap in a substrate printing direction.

Figure 7:
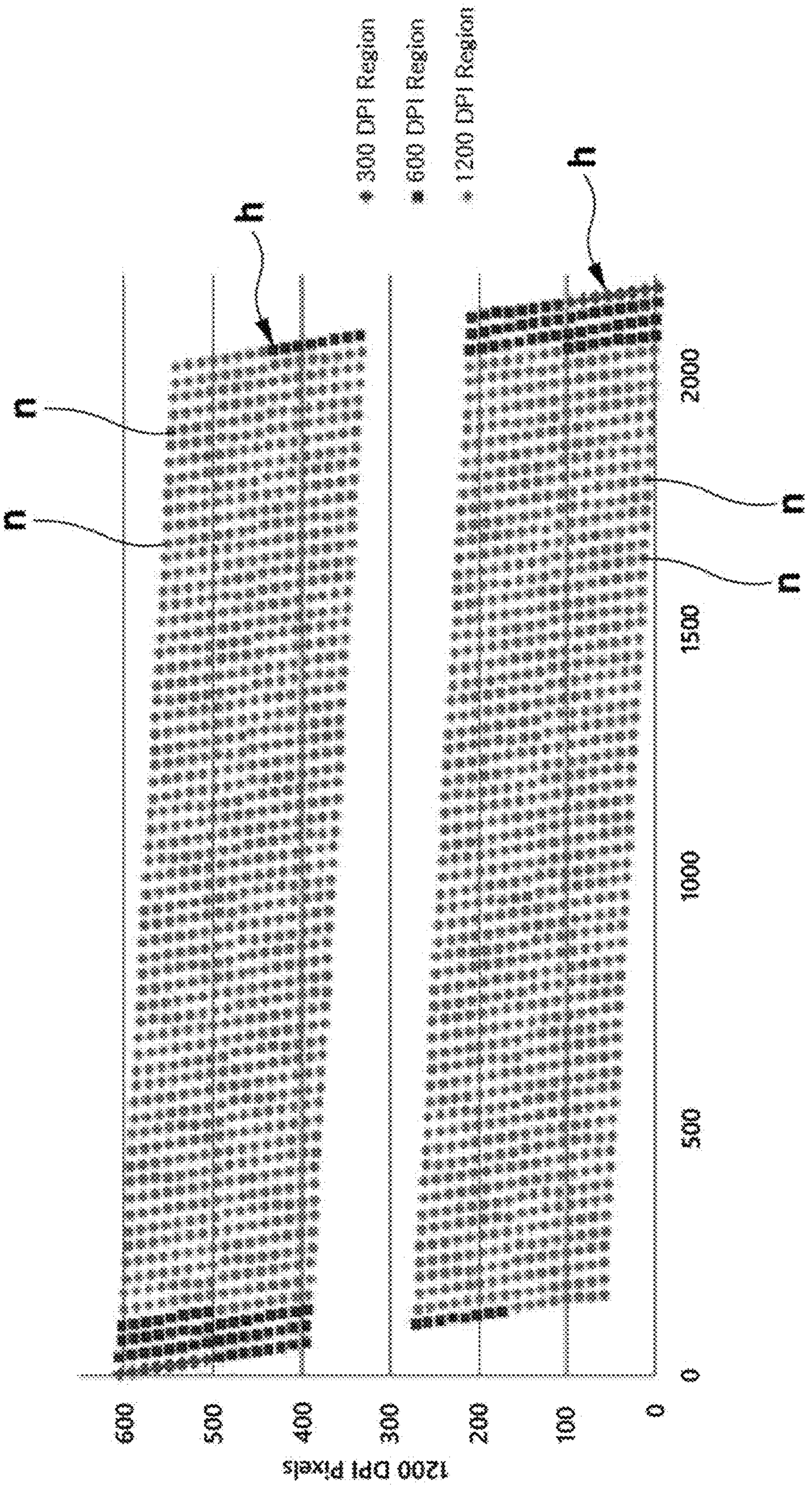
FIG. 7 is a view illustrating a state in which a nozzle is disposed in the inkjet printer device provided with the pad for measuring the ink drop according to the present invention in FIG. 4.

FIG. 7 is a view illustrating a state in which a nozzle is disposed in the inkjet printer device provided with the pad for measuring the ink drop according to the present invention in FIG. 4.

A plurality of nozzles n are installed on a bottom surface portion of the head h, and are arranged in a shape inclined with respect to a horizontal direction of the head h. Alternatively, arrangement of the nozzles n is different for each head h, and may not be the inclined shape.

The reason why the nozzles n are arranged in the inclined shape is to insert the nozzles n as many as within the same size of the head h and also to decrease a distance between the nozzles n so as to increase a resolution and continuously connect the head h on a straight line in the horizontal direction.

Alternatively, according to the head design, the heads h may be arranged in two rows to be continuously connected so that the nozzles n are continuously connected with a predetermined pitch in the horizontal direction.

As illustrated in FIG. 5, a first probe unit 140 includes a first transfer stage 141, which is installed above the work holder wh and performs transfer so that a position is adjustable in X, Y, and Z directions with respect to the substrate 1000, and a first probe 142 which is installed above the first transfer stage 141.

Any known component is applicable to the first transfer stage 141 as long as being a component that adjusts a position of the first probe 142 so as to be in contact with the substrate in the X, Y, and Z directions.

In this embodiment, the first transfer stage 141 includes a uvw stage 141*a* and an Z-direction first transfer stage 141*b* installed on a shaft of the uvw stage 141*a*.

The first probe 142 is installed on an upper end of the Z-direction first transfer stage 141*b*.

The first probe 142 is disposed to be positioned at each of both ends of the substrate 1000.

The first probe 142 may be provided in plurality according to the size of the substrate 1000, and each of the first probes 142 is connected to an alternating voltage applying device 150 to generate an electric field on the substrate 1000 through electrode contact pads 1003 and 1005 of the substrate 1000.

A first ink-drop measurement device 160 capable of measuring a size, a position, and the number of the nano LEDs of an ink drop ejected on a pixel 1001 of the substrate 1000 is installed behind the head part 130.

A controller 170 is provided in the inkjet printer device according to the present invention, and is connected to the head part 130 to operate to control a waveform of a voltage applied to the nozzle.

The head maintenance part 200 includes an Y2 stage 210, which is installed in parallel with the Y1 stage 110 and provided to be movable in the Y direction, a plate device 220, which is installed on the Y2 stage 210 and on which the pad p is disposed, and an ink-drop measurement device 230.

The plate device 220 has a flat panel shape, and has an upper portion to which the pad p is fixed. Even when the pad p having groove portions 10 in the printing direction and the direction perpendicular to the printing direction is fixed to the plate device 220, the plate device 220 may be provided to be rotatable to align a direction of the groove portions 10 with the printing direction.

As the plate device 220 is provided to be rotatable by a known rotating device when necessary, the pad p may be disposed in the printing direction or in the direction perpendicular to the printing direction.

A second ink-drop measurement device 230 is installed behind the X1 stage 120.

The second ink-drop measurement device 230 includes a low-magnification ink-drop measurement camera 231, which measures a length and a degree of separation from a central position of the ink drop deposited on the groove portion 10 of the pad p, and a high-magnification nano-LED measurement camera 232 which measures the number of the nano LEDs inside the ink drop.

Any device is applicable to the low-magnification ink-drop measurement camera 231 for volume and precision as long as being a device capable of measuring a shape of an ink drop, for example, a vision system using a camera, a laser scan device, or an ultrasonic device.

The high-magnification nano-LED measurement camera 232 is used because the size of the ink drop and the size of the nano LED are different from each other by tens of times or more.

In this embodiment, a case in which the second ink-drop measurement device 230 is divided into two is described as an example, and the second ink-drop measurement device 230 may include one measurement device.

An X2 stage 240 is further installed on the head maintenance part 200 so as to be movable in the X direction, and an ink removing device 250 capable of removing the ink drop deposited on the pad P is installed on the X2 stage 240.

A vacuum suction device 251 capable of suctioning the ink drop and/or a UV emitting device 252 capable of curing the ink drop so that the ink drop is attached and removed from the pad p are installed as the ink removing device 250.

A roll supply device 260 may be provided for a case in which the pad p is supplied in a roll manner.

When the pad p is supplied to the roll supply device 260, tensile force may be applied in a roll supply direction to cause the pad p to be stretched in the roll supply direction. However, this problem may be compensated in real time by measuring an actual width of each of the groove portions 10 of the pad p.

A second probe unit 270 is installed above the pad p. In this embodiment, as the roll supply device 260 is provided, the second probe unit 270 is installed above the roll supply device 260.

Figure 8:
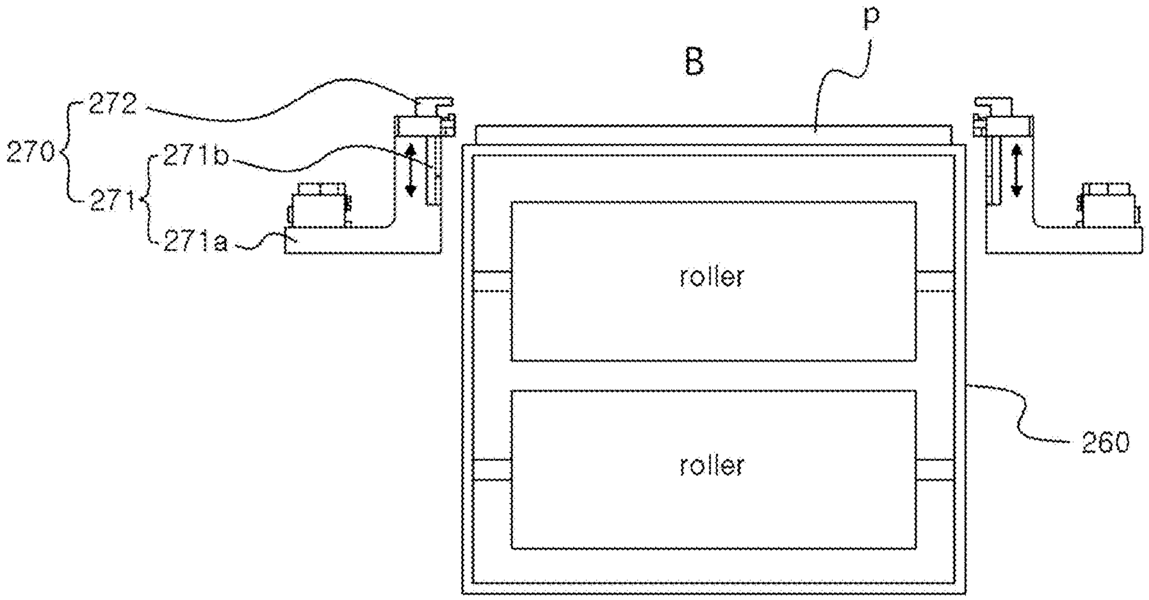
FIG. 8 is a front view of an inkjet printer device to which a pad for measuring an ink drop is applied according to the present invention, when viewed from B.

FIG. 8 is a front view of an inkjet printer device to which a pad for measuring an ink drop is applied according to the present invention, when viewed from B.

As illustrated in FIG. 8, the second probe unit 270 includes a second transfer stage 271, which is installed above the roll supply device 260 and performs transfer so that a position is adjustable in the X, Y, and Z directions with respect to the pad p, and a second probe 272 which is installed above the second transfer stage 271.

Any known component is applicable to the second transfer stage 271 as long as being a component that adjusts a position of the second probe 272 so as to be in contact with the substrate in the X, Y, and Z directions.

In this embodiment, the second transfer stage 271 includes a uvw stage 271*a* and a Z-direction second transfer stage 271*b* installed on a shaft of the uvw stage 271*a*.

The second probe 272 is installed on an upper end of the Z-direction second transfer stage 271*b*.

The second probe 272 is disposed to be positioned at each of both ends of the pad p.

The second probe 272 may be provided in plurality according to the size of the pad p, and each of the second probes 272 is connected to the alternating voltage applying device 150 to generate an electric field on the pad p through electrode contact pads 50 and 60 of the pad p.

A maintenance device 280 that maintains the inkjet head is installed on the head maintenance part 200.

FIGS. 9A to 9C are views illustrating various shapes of a nano LED included inside an ink drop according to the present invention.

A nano LED (NLED) is a known component, and various shapes may be used therefor. For example, a nano LED having a rod shape may be used as illustrated in FIG. 9A.

The nano LED having a rod shape may include a first semiconductor layer, a second semiconductor layer, an active layer disposed between the first semiconductor layer and the second semiconductor layer, an electrode disposed on the second semiconductor layer, and an insulation film disposed to surround outer surfaces thereof.

Alternatively, as in FIG. 9B, a nano LED having a flat panel shape may receive an electrical signal applied to a doped semiconductor crystal from an external power source, and may emit the electrical signal as light having a specific wavelength range.

The nano LED having a flat panel shape may be a light emitting diode (LED), and may be an inorganic light emitting diode having a micrometer or nanometer unit size and made of an inorganic material.

Alternatively, as illustrated in FIG. 9C, the nano LED may have a cylindrical shape, a rocket shape, a conical shape, a hexagonal pyramid shape, or the like, but is not limited thereto. The nano LED may have various shapes such as a regular hexahedron, a rectangular parallelepiped, and a hexagonal column.

Hereinafter, a method for measuring a volume and a position of an ink drop and the number of nano LEDs inside the ink drop by using the inkjet printer device configured as described above will be described.

First, a step (s100) of disposing a pad p for measuring an ink drop (hereinafter referred to as the pad) is performed so that first and second electrode contact pads 50 and 60 are aligned at both sides in a printing direction, respectively, the pad p being manufactured to include a plurality of groove portions 10 with spacing corresponding to a nozzle pitch of the inkjet device, first and second electrodes 30 and 40 provided in a lower portion of each of the groove portions 10, and the first and second electrode contact pads 50 and 60 connected to the first and second electrodes 30 and 40, respectively.

Next, a step (s200) of disposing the pad formed in the step (s100) to be below the inkjet head is performed.

An X1 stage 120 is driven to move an inkjet head h to a head maintenance part 200, and also a Y2 stage 210 is driven to dispose a plate device 220, on which the pad p is installed, to be vertically below the inkjet head h.

In a step (s300), a second transfer stage 271 of a second probe unit 270 is adjusted to allow a second probe 272 to be in contact with the first and second electrode contact pads 50 and 60 provided on the pad p, and then an alternating voltage is applied by an alternating voltage applying device 150 to generate dielectrophoresis force in the groove portions 10 of the pad p.

FIG. 10 is a view illustrating a state in which an ink is deposited throughout a pad for measuring an ink drop according to the present invention.

In a step (s400), the inkjet head performs an operation of spraying ink drops toward the pad p to deposit the ink drops onto the groove portions 10 of the pad p. Then, the ink drops are deposited on the pad p, and nano LEDs are aligned between the first and second electrodes 30 and 40 due to the dielectrophoresis force.

In the pad p, when the groove portions 10 are disposed in a Y direction that is the same direction as a printing direction, the ink drops are deposited in the same shape as illustrated in FIGS. 9A to 9C.

In the pad p, even when the groove portions 10 are disposed in an X direction that is a direction perpendicular to the printing direction, the ink drops are deposited in the same shape as illustrated in FIG. 10.

According to manufacture and assembly tolerances in inkjet head h, and situations in which the ejection is performed, there is an error in impact degree between the ejected ink drops. The ink drops are deposited so that an error in central position of the ink drop is generated by $\Delta x$ and $\Delta y$ in the X direction and the Y direction, respectively, as many as an impact error occurring at the groove portion 10 of the pad p.

Figure 11:
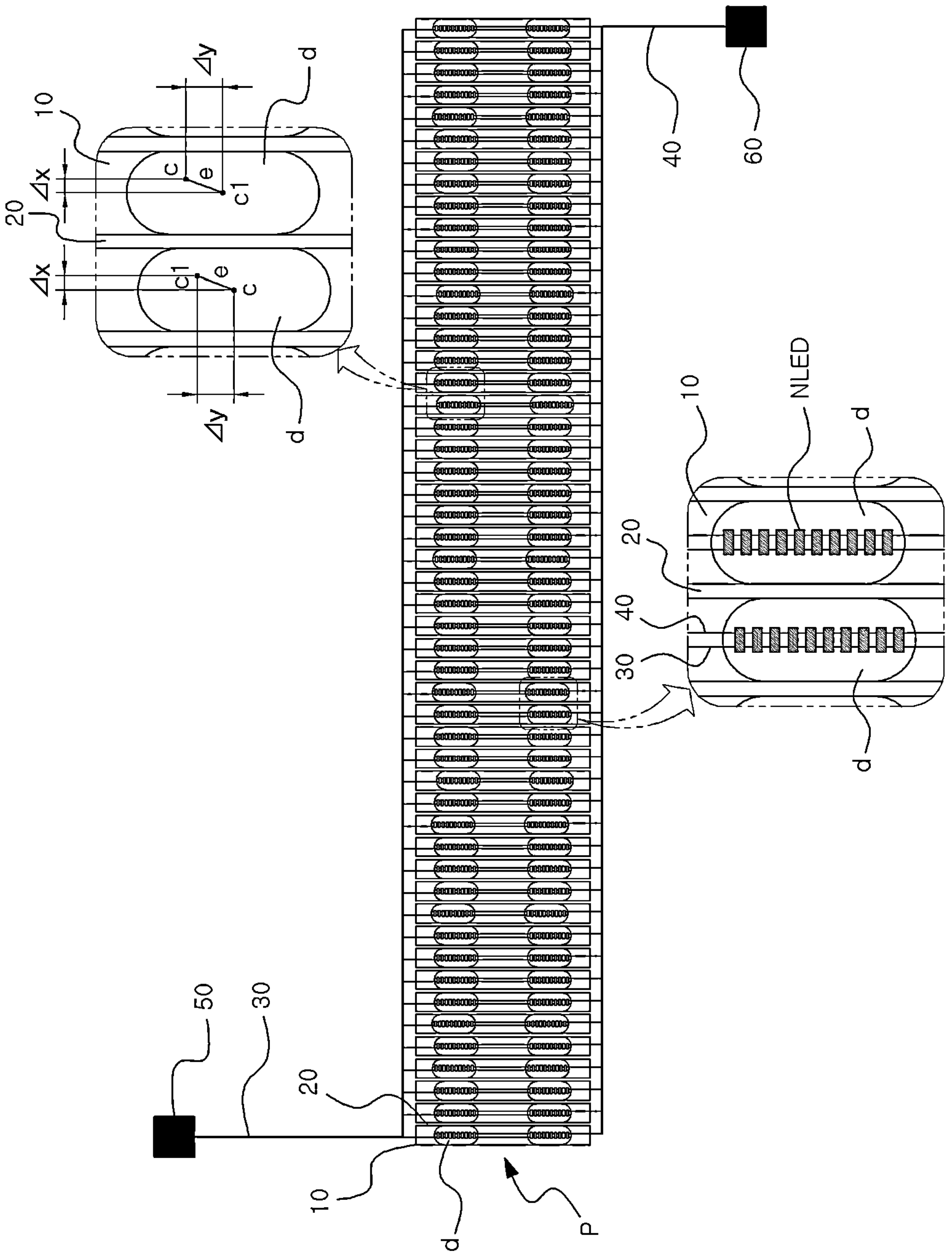
FIG. 11 is a view illustrating a state in which an ink is deposited in a case in which a pad for measuring an ink drop is installed in the same direction as a printing direction according to the present invention.
Figure 12:
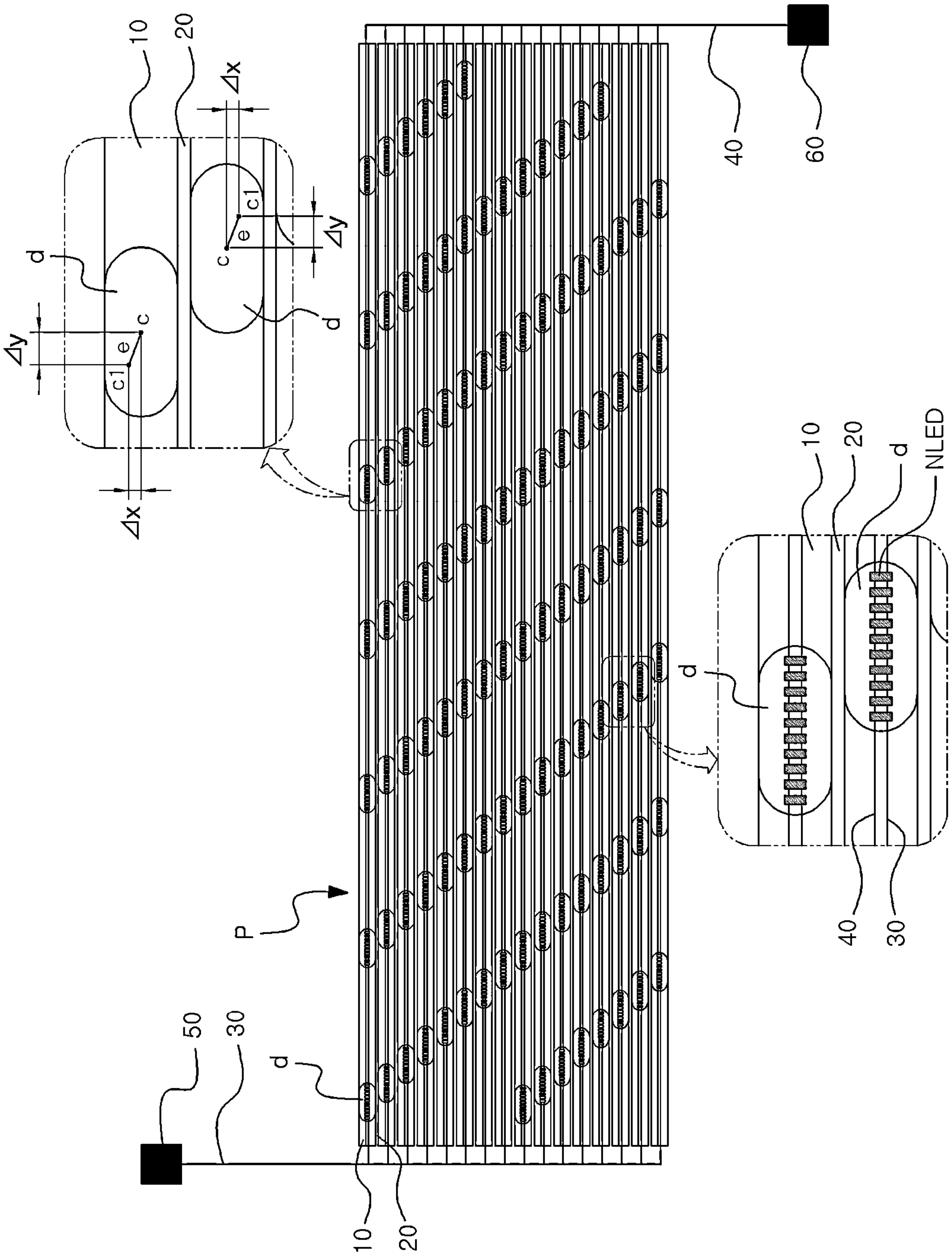
FIG. 12 is a view illustrating a state in which an ink is deposited in a case in which a pad for measuring an ink drop is installed in a direction perpendicular to a printing direction according to the present invention.

FIG. 11 is a view illustrating a state in which an ink is deposited in a case in which a pad for measuring an ink drop is installed in the same direction as a printing direction according to the present invention. FIG. 12 is a view illustrating a state in which an ink is deposited in a case in which a pad for measuring an ink drop is installed in a direction perpendicular to a printing direction according to the present invention.

In a step (s500), a step (s510) is first performed so that the Y2 stage 210 is driven to transfer the pad p, on which the ink drops are deposited, to be below an ink-drop measurement device 230.

Then, a step (s520) is performed of measuring a length l and a position (x, y) of each of the ink drops deposited in the step (s300) as illustrated in FIGS. 11 and 12, thereby measuring a volume and position precision of each of the ink drops.

When a length l and a position c1 (x, y) of each ink drop d in the groove portion 10 are measured by using a vision inspection device as the second ink-drop measurement device 230, the volume of the ink drop d is automatically calculated because a width and a depth of the groove portion 10 are already known.

In a case in which the step (s520) is performed, in this embodiment, the measurement may be performed by a low-magnification ink-drop volume and precision measurement camera 231 of the second ink-drop measurement device 230.

In addition, a position deviation e ($\Delta x$, $\Delta y$) between a center c of each ink drop, which is determined by an alignment mark 30 formed on the pad p, and the position c1 (x, y) of the actually deposited ink drop is automatically calculated by the vision inspection device.

The ink drop spread as long as possible in the groove 10 is more advantageous in measuring a length of the ink drop with higher accuracy.

However, when a small ink drop is made spread in the longitudinal direction of a groove of at least 300 um to 400 um by various variables considered in determining a size of the groove portion 10, i.e., by a shape of the groove portion 10, spacing and a depth of a pattern, and each surface state of the groove portion 10, a required measurement accuracy may be satisfied.

In addition, when the central position c1 of the spread length of each ink drop d deposited on the pad p is found and compared with a reference central position c determined by the alignment mark 30 of the pad p to determine whether the deviation e between the two positions occurs, and to compensate the deviation e in the inkjet device so that the deviation is corrected. Then, the position deviation may be minimized to perform precise printing.

In the step (s500), the ink drop deposited on the pad p is measured to perform ink drop presence/absence measurement about whether ink drops are ejected from all nozzles of an initial inkjet head after the inkjet printer is installed. Accordingly, an insufficient air removal situation or nozzle clogging state in each nozzle may be analyzed.

In the step (s500), in a case in which a specific voltage waveform is applied to a specific nozzle of a head part 130 through a controller 170 to eject a plurality of drops, a volume of the ink drop deposited on the pad p is measured to calculate a volume ejected from the specific nozzle, and a result of the calculation may be used to eject a plurality of ink drops onto the same position of the pad p to set one or a plurality of voltage waveforms in one nozzle for achieving a target ink drop volume.

In the step (s500), in a case in which a specific voltage waveform is applied to a plurality of nozzles of the head part 130 through the controller 170 to eject a plurality of drops, a volume of the ink drop deposited on the pad p is measured to calculate a volume ejected from each nozzle, and a result of the calculation may be used to eject a plurality of ink drops onto the same position of the pad p to set a combination of the plurality of nozzles for achieving a target ink drop volume.

In the step (s500), in a case in which an inkjet device including a plurality of heads ejects ink drops, a volume and a position of the ink drop deposited on the pad p reflecting an effect of crosstalk between the nozzles of the inkjet heads are measured, and results of the measurement may be used to compensate for the position and the volume of each nozzle so as to avoid the crosstalk between the nozzles.

In a step (s600), the number of the nano LEDs in each ink drop d deposited on the pad p is measured by using a high-magnification measurement device 231 and driving the Y2 stage 210 and the X2 stage 240.

A difference in number of nano LEDs of all ink drops d ejected from the same nozzle, and an average number of the nano LEDs are measured through matching of a given map of the pad p, and then the number of the nano LEDs of all the nozzles of the ink head h is measured.

The step (s600) may be performed using a high-magnification nano-LED measurement camera 232.

In the step (s600), in a case in which a specific voltage waveform is applied to a specific nozzle of the head part 130 through the controller 170 to eject a plurality of drops onto one measurement position to overlap each other, the number of nano LEDs per volume of an ink drop deposited on the pad p is measured to calculate the number of the nano LEDs (NLED) per ink drop ejected from the specific nozzle, and a result of the calculation may be used to eject a plurality of ink drops onto the same position of the pad p to set one or a plurality of voltage waveforms in one nozzle for achieving the target number of the nano LEDs (NLED) per ink drop volume.

In the step (s600), in a case in which a specific voltage waveform is applied to a plurality of nozzles to eject a plurality of drops onto one measurement position to overlap each other, the number of nano LEDs (NLED) per volume of an ink drop deposited on the pad p is measured to calculate the number of the nano LEDs (NLED) per total ink drops of each nozzle, and a result of the calculation may be used to eject a plurality of ink drops onto the same position of the pad p to set a combination of the plurality of nozzles for achieving the target number of the nano LEDs (NLED) per ink drop volume.

In the step (s600), in a case in which an inkjet device including a plurality of heads ejects ink drops, the number of nano LEDs (NLED) per volume of the ink drop deposited on the pad p reflecting an effect of crosstalk between the nozzles of the inkjet head is measured, and a result of the measurement may be used to compensate for the number of nano LEDs (NLED) per ink drop volume in each nozzle so as to avoid the crosstalk between the nozzles.

In a step (s700), the Y2 stage 210 is driven to move the pad p to be below an ink removing device 250 installed on the X2 stage 240 after the measuring of the ink drops is all completed.

Thereafter, an operation of removing the ink on the pad is performed while the ink removing device 250 including a vacuum suction device 251 capable of suctioning the ink drop or a UV emitting device 252 capable of curing the ink drop according to an ink shape moves along the X2 stage 240.

In a case in which an operation of setting the inkjet printer device is further required, the steps (s100) to (s700) are repeatedly performed.

The present invention has an advantage that the volume, the position, and the number of nano LEDs (NLED) of the ink drop of each nozzle may be accurately measured with a precision of 0.5% or less simply and rapidly.

Accordingly, in a case in which the inkjet printer device is provided to adjust an optimum voltage wave and to compensate for each nozzle n, more uniform ink drops may be printed due to a different voltage waveform or voltage waveform change compensation for each nozzle so that the number of the nano LEDs exposed to each pixel is uniform to improve uniformity.

Also, when a position accuracy of the ink drop of each nozzle n is checked and compensated, a precise position accuracy error may be minimized.

Accordingly, there is advantage that in a case in which precise printing is required, printing compensating for this impact error of each nozzle may be performed to improve the position accuracy.

The pad according to the present invention may be used, and utilized in various cases as follows.

(1) An ink drop deposited on the pad p is measured to perform ink drop presence/absence measurement about whether ink drops having a sufficient size are ejected from all nozzles of an initial inkjet head after the inkjet printer is installed. Accordingly, an insufficient air removal situation or nozzle clogging state in each nozzle may be checked and appropriately compensated.

(2) In a case in which a specific voltage waveform is applied to a specific nozzle to eject a plurality of drops, a volume of an ink drop deposited on the pad p is measured, and the number of the resulting nano LEDs is measured so that the number of nano LEDs according to a volume ejected from the specific nozzle is calculated.

By using this, a plurality of ink drops onto the same position of the pad p may be ejected to set one or a plurality of voltage waveforms in one nozzle for achieving a target ink drop volume, i.e., the number of the nano LEDs, and select and use a desired voltage waveform.

(3) In a case in which a specific voltage waveform is applied to a plurality of nozzles, and a plurality of drops are mixed and ejected onto one position (e.g., one pixel), a combined volume of the plurality of ink drops deposited on the pad p and the number of the nano LEDs corresponding thereto are measured to calculate a volume ejected from each nozzle.

By using this, a plurality of ink drops may be ejected onto the same position of the pad p to set a combination of a plurality of nozzles for achieving a target ink drop volume and the target number of the nano LEDs, and/or to optimize and select a voltage waveform of each nozzle.

(4) In general, the inkjet head continuously form a plurality of different voltage waveforms up to four or seven to all nozzles, and one or a plurality of selected voltage waveforms may be selected to control the ink drops having sizes corresponding thereto to be ejected.

The inkjet printer device may perform an operation of ejecting the predetermined ink drops from the predetermined nozzles according to pattern information required for each nozzle. Here, sound waves generated during the ejection operation of each nozzle affect a surrounding nozzle when the nozzle performs the ejection.

This causes a problem in that crosstalk in which the surrounding nozzles are reduced in ejection speed of the ink drops and also reduced in volume thereof occurs to degrade printing quality.

Even in this case, the volume and position of the deposited ink drop through the pad according to the present invention may be analyzed to confirm effects of the crosstalk, and the voltage waveform applied to the nozzle may be compensated to minimize this crosstalk.

(5) A position error of an ink drop deposited on the pad p may be measured to identify an error in each nozzle of the inkjet head and appropriately compensate for the error, when RGB pixel printing of a high-resolution display is performed, i.e., when accurate printing of ink drops is required.

Thus, the present invention may be applied even to the fields of display technology and micro-wire printing.

When printing uniformity of the ink drops is 1% or more, the printing technology may be applied to the field of visible display applications, especially the field requiring RGB pixel printing.

Although the preferred embodiments of the present invention have been described, it is understood that the present invention should not be limited to these embodiments but various changes and modifications can be made by one ordinary skilled in the art within the spirit and scope of the present invention as hereinafter claimed. Such modified embodiments should not be individually interpreted from the technical spirit or prospect of the present invention.

What is claimed is:

1. A pad configured to measure a volume, a position, and the number of a nano light emitting diodes (LEDs) of an ink drop which has a predetermined volume and has been sprayed and deposited from a nozzle of a head of an inkjet device, the pad comprising:

a pattern part comprising a plurality of groove portions arranged at a pitch corresponding to a pitch between a plurality of head nozzles, and a wall portion provided between the groove portions, wherein, at a center of each of the groove portions, a first electrode part extends in a longitudinal direction of the groove portion, and a second electrode part is spaced apart from the first electrode part in a width direction to extend in the longitudinal direction of the groove portion, wherein the groove portion is provided to have a length having a size to include all heads existing on the same extension line which are objects to be measured, and is uniformly formed in the same cross-sectional shape along the entire length of the groove portion.

2. The pad of claim 1, wherein the pattern part and the electrode parts are provided in the same direction as a printing direction or a direction perpendicular to the printing direction.

3. The pad of claim 2, wherein a spaced distance between the first electrode part and the second electrode part has a size to be in contact with both ends of the nano LED.

4. The pad of claim 3, wherein a first electrode contact pad is connected to one end of the first electrode part, and a second electrode contact pad is connected to one end of the second electrode part, wherein, when an alternating voltage is applied through each of the first and second electrode contact pads, a force is generated due to an electric field inside the groove portion so that due to dielectrophoresis, one end of the nano LED is aligned with the first electrode, and the other end of the nano LED is aligned to be oriented to the second electrode.

5. The pad of claim 4, wherein the first electrode contact pad is disposed at one side in a width direction of the pad, and the second electrode contact pad is disposed at the other side in the width direction of the pad.

6. The pad of claim 5, wherein the pad is supplied in the form of a flat sheet.

7. The pad of claim 6, wherein the pad is continuously supplied by being provided in the form of a roll so as to be supplied by a predetermined length in a width corresponding to a printing width of a head module including a plurality of inkjet heads and to be removed from the inkjet device.

8. An inkjet device comprising:

the pad of claim 1;

an inkjet printer part; and a head maintenance part installed in parallel with the inkjet printer part, wherein the inkjet printer part comprises:

a Y1 stage on which a work holder configured to support a substrate is disposed and which is provided to be movable in a Y direction;

an X1 stage on which an inkjet head is installed to be higher than a height of the substrate, and which is installed to extend so that the X1 stage is movable to a Y2 stage of the head maintenance part in an X direction perpendicular to the Y direction;

a first transfer probe unit comprising a first transfer stage, which is installed above the substrate to perform transfer so that a position is adjustable in X, Y, and Z directions with respect to the substrate, and a first probe installed above the first transfer stage, wherein the X direction, Y direction and the Z direction are perpendicular to each other;

an alternating voltage applying device connected to the first probe to apply an alternating voltage so as to generate an electric field on the substrate; and a first ink-drop measurement device configured to measure a size, a position, and the number of nano LEDs of the ink drop ejected on a pixel of the substrate, wherein the head maintenance part comprises:

a Y2 stage provided in parallel with the Y1 stage to be movable in the Y direction;

a plate device installed on the Y2 stage and configured to fix the pad;

a second transfer probe unit comprising a second transfer stage, which is installed above the pad to perform transfer so that a position is adjustable in the X, Y, and Z directions with respect to the pad, and a second probe installed above the second transfer stage;

an alternating voltage applying device connected to the second probe to apply an alternating voltage so as to generate an electric field on the substrate; and a second ink-drop measurement device configured to measure a size, a position, and the number of nano LEDs of an ink drop ejected on a groove portion of the pad.

9. The inkjet printer device of claim 8, wherein an X2 stage is further installed on the head maintenance part so as to be movable in the X direction, wherein an ink removing device configured to remove the ink drop deposited on the pad is installed on the X2 stage.

10. The inkjet printer device of claim 9, wherein a roll supply device configured to continuously supply the pad to the plate device in a roll manner is further installed on the head maintenance part.

11. The inkjet printer device of claim 9, wherein the ink removing device comprises a vacuum suction device configured to suction the ink drop.

12. A method for measuring the ink drop sprayed and deposited from the inkjet head of the inkjet printing device to which the pad of claim 1 is applied, the method comprising:

a step (s100) of forming a plurality of groove portions with spacing corresponding to a pitch of a nozzle of an inkjet device, supplying the pad in which a cross-section of each of the groove portions is formed to be uniform along the entirety of a length of the groove portion, and supporting the pad by a plate;

a step (s200) of disposing the pad supported in the step (s100) to be below the inkjet head, wherein the groove portions are aligned to be disposed vertically below the nozzle;

a step (s300) of applying an alternating voltage to first and second electrodes of the pad aligned in the step (s200) to generate a dielectrophoresis force by an electric field in the groove portions of the pad;

a step (s400) of forming an electric field in the pad disposed in the step (s300) and simultaneously spraying an ink drop by the nozzle to deposit the ink drop onto the groove portion of the pad;

a step (s500) of measuring a length and a central position deviation of each of the ink drops deposited in the step (s400) by using a low-magnification ink-drop measurement device; and a step (s600) of measuring the number of nano LEDs in each of the ink drops deposited on the pad by using a high-magnification measurement device after the measurement in the step (s500).

13. The method of claim 12, wherein, in the step (s500), the ink-drop measurement device measures the length of the ink drop deposited on the pad (p) to measure a volume of the ink drop.

14. The method of claim 12, wherein, in the step (s500), the ink-drop measurement device measures a central position (c1) of the ink drop deposited on the pad (p), and compares the central position (c1) with a reference central position (c) of each of the ink drops, which is determined by an alignment mark formed on an edge of the pad, so as to measure a position deviation e (Δx, Δy) between the two positions.

15. The method of claim 12, wherein, in the step (s500), the ink drop deposited on the pad (p) is measured to perform ink drop presence/absence measurement about whether ink drops are ejected from all nozzles of an initial inkjet head after an inkjet printer is installed, so that an insufficient air removal situation or a nozzle clogging state in each of the nozzles is analyzed.

16. The method of claim 12, wherein, in the step (s500), in a case in which a specific voltage waveform is applied to a specific nozzle to eject a plurality of drops, a volume of the ink drop deposited on the pad (p) is measured to calculate a volume ejected from the specific nozzle, and a result of the calculation is used to eject a plurality of ink drops onto the same position of the pad (p) to set one or a plurality of voltage waveforms in one nozzle for achieving a target ink drop volume.

17. The method of claim 12, wherein, in the step (s500), in a case in which a specific voltage waveform is applied to a plurality of nozzles to eject a plurality of drops, a volume of the ink drop deposited on the pad (p) is measured to calculate a volume ejected from each of the nozzles, and a result of the calculation is used to eject a plurality of ink drops onto the same position of the pad (p) to set a combination of the plurality of nozzles for achieving a target ink drop volume.

18. The method of claim 12, wherein, in the step (s500), in a case in which an inkjet device including a plurality of heads ejects ink drops, a volume and a position of the ink drop deposited on the pad (p) reflecting an effect of crosstalk between nozzles of the inkjet head are measured, and results of the measurement are used to compensate for the position and the volume in each of the nozzles so as to avoid the crosstalk between the nozzles.

19. The method of claim 12, wherein, in the step (s600), the high-magnification measurement device for the ink drop measures the number of the nano LED of each of the ink drops deposited on the pad (p) to measure the number of the nano LED per volume of the ink drop.

20. The method of claim 12, wherein, in the step (s600), in a case in which a specific voltage waveform is applied to a specific nozzle to eject a plurality of drops onto one measurement position to overlap each other, the number of the nano LED per volume of the ink drop deposited on the pad (p) is measured to calculate the number of the nano LED per ink drop ejected from the specific nozzle, and a result of the calculation is used to eject a plurality of ink drops onto the same position of the pad (p) to set one or a plurality of voltage waveforms in one nozzle for achieving the target number of the nano LED per ink drop volume.

21. The method of claim 12, wherein, in the step (s600), in a case in which a specific voltage waveform is applied to a plurality of nozzles to eject a plurality of drops onto one measurement position to overlap each other, the number of the nano LED per volume of the ink drop deposited on the pad (p) is measured to calculate the number of the nano LED per total ink drops in each of the nozzles, and a result of the calculation is used to eject a plurality of ink drops onto the same position of the pad (p) to set a combination of the plurality of nozzles for achieving the target number of the nano LED per ink drop volume.

22. The method of claim 12, wherein, in the step (s600), in a case in which an inkjet device including a plurality of heads ejects ink drops, the number of the nano LED per volume of the ink drop deposited on the pad (p) reflecting an effect of crosstalk between the nozzles of the inkjet head is measured, and a result of the measurement is used to compensate for the number of the nano LED per volume of the ink drop in each of the nozzles so as to avoid the crosstalk between the nozzles.

23. The method of claim 12, further comprising a step (s700) of removing the ink on the pad after the measuring of the ink drops is all completed in the step (s600).

* * * * *